US006764232B1

(12) United States Patent
Dunn

(10) Patent No.: US 6,764,232 B1
(45) Date of Patent: Jul. 20, 2004

(54) DEVELOPER EXIT TANK FOR IMMERSION TYPE PRINTING PLATE PROCESSOR

(75) Inventor: Jerry Dean Dunn, Milliken, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/639,885

(22) Filed: Aug. 13, 2003

(51) Int. Cl.[7] .................................................. G03D 03/02

(52) U.S. Cl. ........................ 396/602; 396/617; 396/622; 396/626; 134/64 P; 355/27

(58) Field of Search ................................. 396/602, 603, 396/617, 622, 626; 355/27–29; 134/64 P, 122 P

(56) References Cited

U.S. PATENT DOCUMENTS 3,589,261 A 6/1971 Krikelis
4,091,404 A 5/1978 Schörnig et al.
4,215,927 A 8/1980 Grant et al.
4,239,368 A 12/1980 Krause et al.
4,796,042 A 1/1989 Mappin et al.
5,140,356 A * 8/1992 Ohba et al. ................. 396/617

FOREIGN PATENT DOCUMENTS

JP 57-129441 8/1982
JP 08-123039 * 5/1996

* cited by examiner

*Primary Examiner*—D. Rutledge
(74) *Attorney, Agent, or Firm*—RatnerPrestia

(57) ABSTRACT

A lithographic printing plate processor having an immersion developing tank followed by a developer exit tank in which a printing plate driven through the immersion tank is subjected to a spray of clean developer wherein the exit tank is isolated from the developing tank and there is associated with the exit tank developer spray system a clean developer recirculating loop. The recirculating loop includes a holding tank, a pump and a filter and its elements are isolated, separate and distinct from the developing tank.

8 Claims, 1 Drawing Sheet

10 53 55 22 18 38 18 18 16 20' 48 37 46 56 36 14 23 30 28 50 24 35 12 34 33 44 52 54 42

DEVELOPER EXIT TANK FOR IMMERSION TYPE PRINTING PLATE PROCESSOR

FIELD OF THE INVENTION

This invention relates to lithographic printing plate immersion type processors and more particularly to a lithographic printing plate processor having an improved developer exit tank isolated from the developing tank.

BACKGROUND OF THE INVENTION

In the lithographic printing process, a lithographic plate comprising an aluminum sheet is initially coated with a photosensitive layer usually containing, among other things, one or more resins. A negative is applied over the photosensitive layer, and the two are exposed to high intensity light. Alternatively, the coated plate may be exposed to imaging radiation directly using an imaging laser whose beam is scanned and modulated to form an image on the plate. The exposed plate is processed to develop it. In development, the image areas of the photosensitive layer are retained on the plate surface and the non-image areas are removed. Although some manual developing is still done, the large scale commercial use of lithographic plates has made automatic processing of necessity. Numerous apparatus have been proposed to perform such processes.

In known apparatuses of this type, the processing liquid used for developing printing plates is contained in a developing tank into which a plate to be developed is immersed during the development step. When spraying developer onto the plate surface is part of the process, processing liquid is typically pumped from the developing tank to the sprays by means of a circulating pump and a filter. U.S. Pat. No. 3,589,261 issued Jun. 29, 1971 to Krikelis discloses a typical immersion processor useful for developing a lithographic printing plate.

In an effort to preserve developer and comply with environmental regulations most processors today employ developer recirculation and filtration of the developer. In a typical such system, at least one filter is arranged in the flow path between the tank and the printing plate developing tank, to protect the printing plate being developed from dirt particles and loosened particles of the layer which are washed away with the processing liquid. Normally, the filter is positioned on the delivery side of a circulating pump. U.S. Pat. No. 4,239,368 issued Dec. 16, 1980 to Krause et al., discloses such a recirculation/filtration system for use with printing plate processors.

A number of processors employ a developer exit tank immediately following the developing tank in which the developed printing plate is subjected to a rinse with clean developer or water. FIG. 1 shows a schematic elevation of the portion pertinent to the present invention of an immersion type developing apparatus commercially available under the name Mercury of the Americas made by Heights Design Production Limited of Halifax, West Yorkshire, UK.

As shown in FIG. 1 the developer apparatus 10 comprises a developer tank 12 which contains developer solution 14 into which a lithographic printing plate 16 is immersed. A number of drive and guide rollers 18 drive and guide the printing plate through the developer tank 12. At the exit of the developing tank 12 there is a developer exit tank 20. A pair of squeegee rollers 22 serve to remove remaining developer from the plate surface, before the plate enters the developer exit tank 20.

The exit tank 20 is in communication with the developing tank 12 through a port 26 designed to return the developer to the developing tank 12. The port 26 may be closed and the developer exit tank 20 may be disconnected from the main tank and may be connected through a valve 23 to a drain 24 and therefrom to a desired container (not shown) for emptying the exit tank. This latter feature is primarily intended for use when instead of using developer solution for rinsing the plate exiting the developer tank, the plate is subjected to a water rinse; in such case the drain 24 is intended to be connected to a water disposal drain such as a sewer line.

The processor further includes a pump 34 and a filtration system 36. A developer recirculation loop is formed by connecting the developer tank 12 to pump 34 through pipe 33; the pump output is connected to filtration system 36 through pipe 35; pipe 37 brings filtered developer back to the developer exit tank 20 where developer is applied to the developed plate through a spray system 38.

Such arrangement is unsatisfactory. Developer in the developing tank contains a large amount of loosened particles of the layer that is being processed. Using the same developer both in the immersion section of apparatus and in the exit section results in the transfer of such particles back onto the developed surface. Proposed solutions to date appear to require the use of rather sophisticated, and therefore expensive, filtration methods to generate the clean developer required for this stage of the plate processing, as exemplified by the filtering system shown in aforementioned Krause et al patent if one is to avoid the equal expensive and usually time consuming process of frequently changing filters in less sophisticated systems.

The typical processor of the prior art will also comprise additional processing stations 28 and 30 which may provide additional rinsing, gum application etc. Such additional stations are not relevant to the subject matter of the present invention.

SUMMARY OF THE INVENTION

In an effort to provide a practical solution to the aforementioned problem there is provided a lithographic printing plate processor of the type comprising an immersion developing tank followed by a developer exit tank in which a printing plate driven through the immersion tank is subjected to a spray of clean developer wherein the exit tank is isolated from the developing tank and there is associated with the exit tank developer spray system a clean developer recirculating loop comprising a holding tank, a pump and a filter, said clean developer recirculating loop being isolated, separate and distinct from said developing tank.

Similarly in accordance with this invention there is provided a method for simplifying the filtering requirements of the developer circuit in processors comprising an immersion developing section followed by a clean developer exit tank the method comprising isolating the developer used in the exit tank from the developer used in the developing tank by providing separate and distinct developer circulation loops for the developer used in the developing tank and the clean developer used in the exit tank.

DETAILED DESCRIPTION OF THE INVENTION

The invention will next be described with reference to the figures wherein same numerals indicate same elements in all figures. The figures represent in schematic form embodiments of the invention and are intended solely for illustrating the invention. They are therefore not to scale, neither do they include numerous elements not essential in explaining the subject matter claimed.

Figure 1:
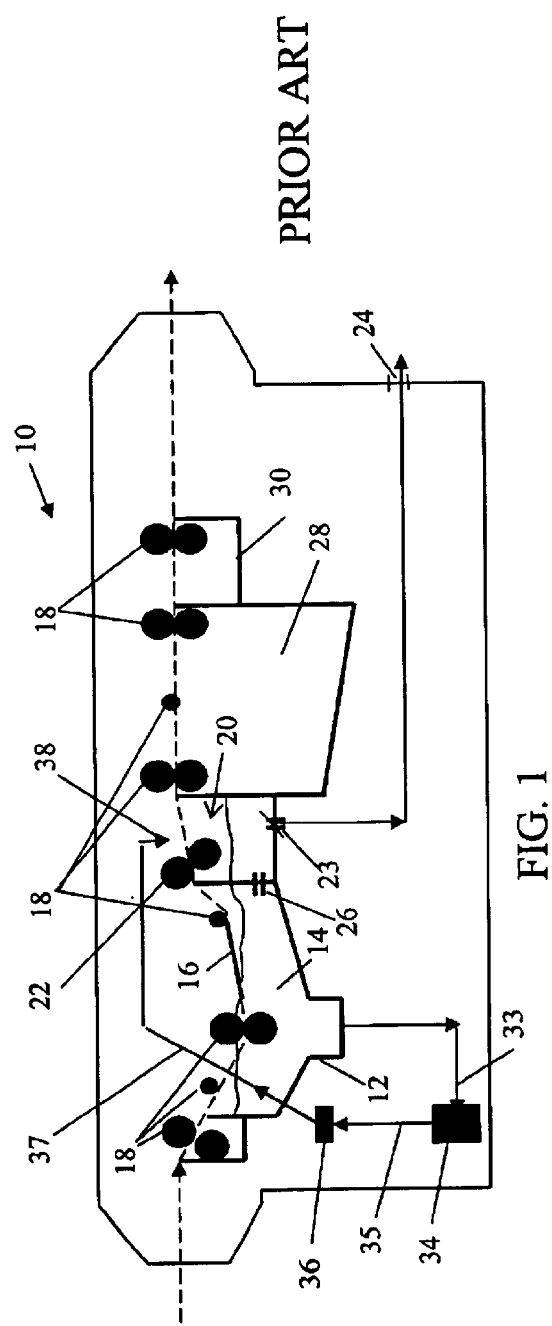
FIG. 1 is a schematic elevation representation of the functional elements of a prior art immersion processor.
Figure 2:
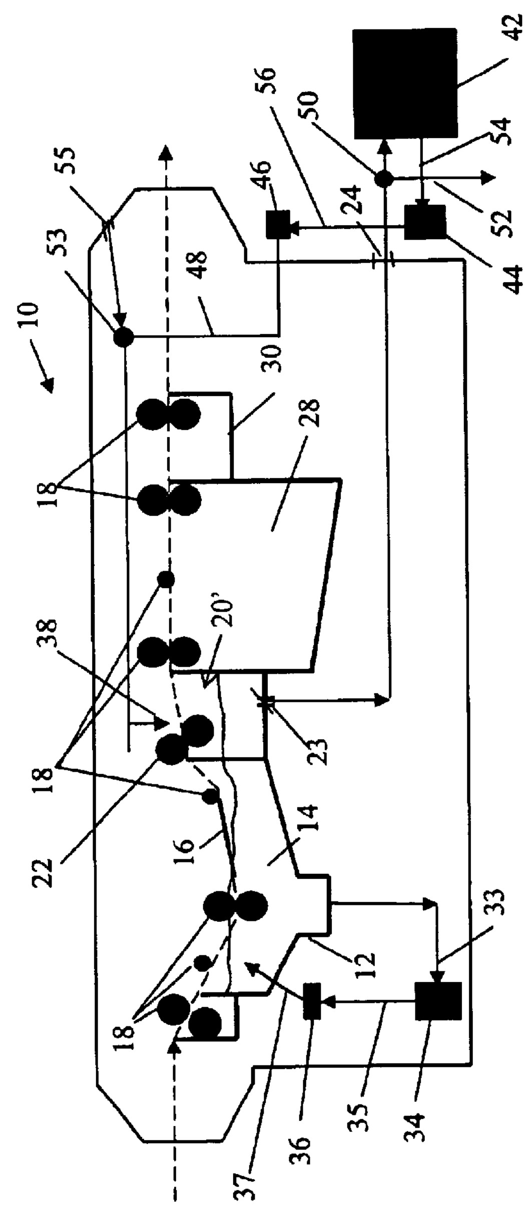
FIG. 2 shows in schematic elevation the prior art processor illustrated in FIG. 1 following modification in accordance with this invention.

Referring next to FIG. 2 there is shown an apparatus substantially the same as the apparatus illustrated and described with reference to FIG. 1 that has been modified in accordance with the present invention. As shown in FIG. 2 the developer exit tank 20' is no longer in fluid communication with the immersion developer tank 12. Furthermore, the filtered developer connection 37 that connects the exit tank developer spray system 38 shown in FIG. 1 has also been severed, and the recirculation loop for the developer tank 12 no longer includes any developer or other fluid from exit tank 20'.

As shown in FIG. 2 a bulk container 42 is connected to the existing drain 24 of the processor preferably through a two way valve 50. Two way valve 50 permits directing rinsing fluid passing through drain 24 to either the bulk container 42 or to any other liquid disposal system as permitted. by local environmental regulations, including a private or municipal sewer line 52.

The bulk container 42 is connected via pipe 54 to a pump 44 whose output is connected to filter 46 via pipe 56. From filter 46 rinsing fluid is directed through valve 53 to the exit tank spray system 38. Thus a totally separate and distinct recirculation loop is formed between the drain of exit tank 20' the bulk container 42, the pump 44, the filter 46 the exit tank spray system 38 and the exit tank 20', with minimum modification or invasion of the existing processor.

Valve 53 serves to switch the spray system 38 out of the recirculating loop and connect it to a second input 55. Input 55 permits connecting a municipal water source to the spray. By also switching valve 50 to direct the output from the exit tank to pipe 52, the recirculating system is completely bypassed restoring the original water wash function of the processor. On the other hand by switching valves 50 and 52 to complete the recirculation loop, clean developer from tank 42 may be used as the rinsing fluid to rinse a plate in the exit tank. Because the plate at this stage carries little detritus and developed material, simple filtration of the recirculated developer is adequate to provide the degree of cleanliness required in the exit tank.

The addition of the second recirculation loop according to this invention is also useful in cases where either due to water conservation rules or gray water disposal requirements water may not be disposed by simply dumping down the drain. In such case, when water may be used instead of developer for the rinsing fluid, the water is recirculated in a manner similar to the developer.

Whether recirculation of the developing tank developer is maintained will depend on the nature and function of the developing tank. For example, if a spray system is part of the developing tank the recirculation loop will remain functional. On the other hand, if the processor was using the recirculation loop only to supply the developer spray in the developing exit tank 20, this loop will no longer be necessary and is, preferably, disabled. In an alternate embodiment not illustrated, depending on the particular processor structure and mechanical features, it may be possible to sever this loop from the developing tank when the processor does not use this loop as part of the developing tank processing cycle, and use it to power the exit tank spray, thereby replacing external pump 44 and filter 46.

In operation a lithographic plate first traverses the immersion developer tank where it is subjected to development, typically comprising a softening and wash off of the unhardened areas of the plate. The developer used in the immersion developer tank is recirculated and may be filtered in a first filtering system. However because this developer is no longer used to rinse off the developed plate, filtration may be minimal or even completely omitted. Upon exiting the developer tank the plate is squeegeed between rollers 22 and sprayed with clean developer from tank 42. This developer is recirculated through the second recirculation loop which is totally isolated from the first recirculation loop. This developer is substantially less contaminated with development detritus as compared with the developer in the development tank, and does not require either extensive filtration or frequent replacement.

The addition of the second recirculation loop to an existing processor is typically a simple matter as most processors having an exit developer tank also include a drain for such tank. Thus all one has to do to implement this invention is to disconnect or plug existing connections between the developer tank and the exit tank, and connect the exit tank drain to a recirculating system comprising a pump. As a minimum the pump may be connected between the exit tank and the developer supply to the plate in the exit tank, which is usually just a spray system. However it is preferred to use a bulk storage tank as describe above together with a simple filter Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A lithographic printing plate processor comprising an immersion developer tank followed by a developer exit tank comprising a rinsing fluid applicator, the processor including a plate drive comprising a plurality of plate drive elements for guiding a printing plate through said immersion developer tank and said exit tank, wherein a plate exiting said developer tank enters said exit tank through a pair of squeegee rollers and is subjected to said rinsing fluid, and wherein said exit tank further includes a rinsing fluid drain, the printing plate processor further including a rinsing fluid recirculating loop connected between said exit tank drain and said rinsing fluid applicator and valve means to selectively connect said recirculating loop between said exit tank drain and said fluid applicator.

2. The processor according to claim 1 wherein said recirculating loop further comprises a bulk fluid storage tank, a pump and a filter system and wherein fluid exiting said exit tank drain is directed to said bulk storage tank and fluid from said bulk storage tank is directed through said filter system to said rinsing fluid applicator.

3. The processor according to claim 2 wherein said rinsing fluid is developer.

4. The processor according to claim 2 wherein said processor includes a housing, said exit tank drain is connected to said housing and is accessible from outside said housing and wherein said recirculating loop is formed substantially outside said housing by connecting said recirculating loop to said exit tank drain on said housing.

5. The processor according to claim 4 wherein said rinsing fluid applicator comprises a fluid spraying system.

6. A method for converting a lithographic printing plate processor comprising an immersion developer tank followed by a developer exit tank comprising a rinsing fluid applicator to use rinsing fluid uncontaminated by developer from the immersion developer tank, the processor further comprising a plate drive comprising a plurality of plate drive elements for guiding a printing plate through said immersion developer tank and said exit tank, wherein a plate exiting said developer tank enters said exit tank through a pair of squeegee rollers and is subjected to said rinsing fluid, and wherein said exit tank further includes a rinsing fluid drain, the method comprising forming a rinsing fluid recirculating loop by connecting between said exit tank drain and said rinsing fluid applicator a valve means to selectively connect said recirculating loop between said exit tank drain and said rinsing fluid applicator, connecting an external bulk storage tank to said valve, connecting a recirculation pump to said tank and connecting an output of said pump through a filtration system to said rinsing fluid applicator.

7. The method according to claim 6 wherein said rinsing fluid is developer.

8. The method according to claim 6 wherein said rinsing fluid is water.

* * * * *